US008755538B2

(12) United States Patent
Kwon

(10) Patent No.: US 8,755,538 B2
(45) Date of Patent: Jun. 17, 2014

(54) TUNING SOUND FEED-BACK DEVICE

(76) Inventor: Dae Hoon Kwon, Seoul (KR)

( * ) Notice: Subject to any disclaimer, the term of this patent is extended or adjusted under 35 U.S.C. 154(b) by 620 days.

(21) Appl. No.: 13/000,462

(22) PCT Filed: Sep. 18, 2008

(86) PCT No.: PCT/KR2008/005512
§ 371 (c)(1),
(2), (4) Date: Dec. 21, 2010

(87) PCT Pub. No.: WO2010/002069
PCT Pub. Date: Jan. 7, 2010

(65) Prior Publication Data
US 2011/0103616 A1 May 5, 2011

(30) Foreign Application Priority Data
Jun. 30, 2008 (KR) ........................ 10-2008-0062207

(51) Int. Cl.

| | |
|---|---|
| ***H04R 3/00*** | (2006.01) |
| ***H03G 5/00*** | (2006.01) |
| ***H03G 3/00*** | (2006.01) |
| ***H03G 9/00*** | (2006.01) |

(52) U.S. Cl.
USPC ............. 381/96; 381/108; 381/102; 381/103; 381/98; 381/104

(58) Field of Classification Search
USPC ............. 381/96, 98, 100, 101, 102, 103, 108, 381/119, 58, 59, 104
See application file for complete search history.

(56) References Cited

U.S. PATENT DOCUMENTS

| | | | | |
|---|---|---|---|---|
| 6,047,601 A | | 4/2000 | Foster | |
| RE38,405 E | * | 1/2004 | Clair et al. | 381/82 |
| 2007/0025559 A1 | | 2/2007 | Mihelich et al. | |

FOREIGN PATENT DOCUMENTS

| | | |
|---|---|---|
| JP | 11-271447 | 10/1999 |
| JP | 2003-347869 | 12/2003 |
| WO | WO 00/44200 | 7/2000 |

* cited by examiner

*Primary Examiner* — Vivian Chin
*Assistant Examiner* — David Ton
(74) *Attorney, Agent, or Firm* — Sherr & Jiang, PLLC

(57) ABSTRACT

Disclosed is a tuning sound (TS) feedback apparatus. The tuning sound (TS) feedback apparatus includes: a TS pick-up casing which is disposed and fixed inside or near the hearing organ of a sound engineer who manages tuning operations for sound output from a sound output terminal of a sound device having an equalizer; a sound/electric conversion element which is included in the TS pick-up casing, picks up the TS output from the sound output terminal of the sound device, and converts the picked-up TS into an electrical signal; and a TS output module which is included in the TS pick-up casing, converts the TS converted into the electrical signal by the sound/electric conversion element into wired or wireless communication data to be used for external communication, and transmits the data to the sound device.

4 Claims, 6 Drawing Sheets

(a)

(b)

(c)

TUNING SOUND FEED-BACK DEVICE

CROSS REFERENCE TO PRIOR APPLICATIONS

This application is a National Stage Patent Application of PCT International Patent Application No. PCT/KR2008/005512 (filed on Sep. 18, 2008) under 35 U.S.C. §371, which claims priority to Korean Patent Application No. 10-2008-0062207 (filed on Jun. 30, 2008), which are all hereby incorporated by reference in their entirety.

TECHNICAL FIELD

The present invention relates to a tuning sound (TS) feedback apparatus. More particularly, it relates to a TS feedback apparatus including sound pick-up modules which are systematically connected and disposed to be used for picking up a TS output from a sound output terminal of a sound device in a state disposed inside or near the hearing organ of a sound engineer, unlike a conventional tuning microphone, and transmitting feedback of the TS so as to enable a TS pick-up position and a position of the actual hearing organ of a listener (that is, the actual sound pick-up position of the listener) to be the same, thereby maximizing reliability of sound tuning operations using the TS as a source and enabling an equalizer of the sound device to have a proper level sound output ability.

BACKGROUND ART

As various sound devices including sound output terminals such as speakers have been developed, various types of multimedia systems utilizing the sound devices, for example, loudspeaker systems for lecture hall/broadcasting/facility use, stereophonic systems for home/facility use, audio systems for home/facility use, audio systems for car use, and the like have been widely and actively used.

As described above, with the spread of the multimedia systems using the sound devices, the task of "how to properly transfer sound data output from a sound output terminal (for example, a speaker) of a sound device to listeners has become a very important issue, and accordingly, related companies have tried in various ways to solve the corresponding issues.

Conventionally, in an effort to solve the problem, as illustrated in FIG. 1, a related company equips a facility S (for example, a lecture hall, a broadcasting station, a house, a theater, a commercial facility, a car, or the like) having a sound device 2 and a multimedia system with a tuning microphone 5 to repeatedly perform a series of sound tuning operations using the tuning microphone 5 until a proper sound is obtained. The series of sound tuning operations include: an operation of outputting tuning sound (TS) through a sound output terminal 1 such as a speaker; an operation of picking up the TS through the tuning microphone 5; an operation of allowing a sound engineer of the related company to connect and install a large measurement device 4 to a part of the sound device 2 to enable the TS picked up by the tuning microphone 5 to be fed back through the measurement device 4; an operation of allowing the sound engineer to measure the TS fed back through the measurement 4 to control a volume level of the TS manually and transmit the volume level-controlled TS to an equalizer 3 of the sound device 2; an operation of re-outputting the volume level-controlled TS from the equalizer 3 through the sound output terminal 1; and the like. Thereafter, as illustrated in FIG. 2, when the sound device 2 and the multimedia system are actually used, the sound tuning operations are performed so that the sound data output from the sound output terminal 1 of the sound device 2 can be properly listened by the listener M.

In this case, the aforementioned tuning microphone 5 functions as a hearing organ E of the listener M (see FIG. 2) and exclusively and continuously performs the function of picking up the TS and feeding the TS back to the measurement device 4 during the series of sound tuning operations.

In this technique, as described above, the sound engineer of the related company repeatedly performs the operations of receiving feedback of the TS picked up by the tuning microphone 5 through the measurement device 4, controlling the volume level of the fed-back TS manually, and re-outputting the TS, to complete the series of sound tuning processes.

In this case, the TS picked up by the tuning microphone 5 is used as a basic source in a volume level control mechanism performed by the sound engineer, so that the problem of how to pick up the TS by the tuning microphone 5 and feed the TS back is considered to be a very important factor in terms of sound tuning quality.

However, the conventional tuning microphone 5 is generally disposed at a position in the facility S determined by the sound engineer. Therefore, the position of the tuning microphone 5 may be significantly different from the position of the hearing organ E of the listener M (that is, the actual sound pick-up position of the listener M), as illustrated in FIG. 2. As a result, when the sound device 2 and the multimedia system are actually used, the TS picked up by the tuning microphone 5 may be significantly different from the sounds the listener M hears.

In addition, in this case, even though the sound engineer of the related company normally performs the series of sound tuning operations (that is, the operations of receiving the feedback of the TS picked up by the tuning microphone 5 through the measurement device 4, controlling the volume level of the fed-back TS manually, and re-outputting the TS) by using the TS picked up by the tuning microphone 5, the equalizer 3 of the sound device 2 cannot acquire a moderate sound output ability. As a result, when the sound device 2 and the multimedia system are actually used, even if a sound volume control operation is performed by the equalizer 3, the sound data finally output from the sound output terminal 1 may have degraded sound quality (pitch, clearness and tone quality) different from the actual hearing situation of the listener M.

Consequently, the listener M who is the final consumer of the sound data has to take disadvantages caused by the degradation in the sound data quality (pitch, clearness and tone quality).

Moreover, conventionally, in order to control the volume level of the TS picked up by the tuning microphone 5 and normally re-output the TS, a series of measurement operations using the large measurement device 4 and volume level operations have to be additionally performed. Therefore, the related company may have additional problems, for example, problems with installation of additional measurement devices 4 and additional manual manipulation of the measurement devices 4.

DISCLOSURE OF INVENTION

Technical Problem

Therefore, the present invention has been made in view of the above problems, and the present invention provides a tuning sound (TS) feedback apparatus including sound pick-up modules which are systematically connected and disposed to be used for picking up a TS output from a sound output terminal of a sound device in a state disposed inside or near the hearing organ of a sound engineer, unlike a conventional tuning microphone, and transmitting feedback of the TS. Accordingly, a TS pick-up position and a position of the actual hearing organ of the listener (that is, the actual sound pick-up position of a listener) can be the same, thereby maximizing reliability of sound tuning operations using the TS as a source and enabling an equalizer of the sound device to have a proper level sound output ability.

The present invention further provides a TS feedback apparatus further including sound processing modules which are connected and disposed to be used for automatic correction of a volume level of the TS picked up by the sound pick-up modules with respect to a reference hearing line and feeding the corrected TS back to an equalizer of the sound device. Accordingly, additional manual operations (for example, operations of measuring the fed-back TS, controlling the volume level of the fed-back TS, and the like) utilizing a measurement device are not needed, so that various problems of a sound tuning related company (including the sound engineer) with additional installation of the measurement device and the additional manual manipulation of the measurement device can be solved.

Technical Solution

In an aspect, the present invention provides a tuning sound (TS) feedback apparatus including: a TS pick-up casing which is disposed and fixed inside or near the hearing organ of a sound engineer who manages tuning operations for sound output from a sound output terminal of a sound device having an equalizer; a sound/electric conversion element which is included in the TS pick-up casing, picks up the TS output from the sound output terminal of the sound device, and converts the picked-up TS into an electrical signal; and a TS output module which is included in the TS pick-up casing, converts the TS converted into the electrical signal by the sound/electric conversion element into wired or wireless communication data to be used for external communication, and transmits the data to the sound device.

Advantageous Effects

According to the present invention, a TS pick-up position and the position of the actual hearing organ of the listener (that is, the actual sound pick-up position of a listener) can be the same, so that reliability of sound tuning operations using the TS as a source can be maximized and an equalizer of the sound device can guarantee a proper level sound output ability.

In addition, according to the present invention, additional manual operations (for example, operations of measuring the fed-back TS, controlling a volume level of the fed-back TS, and the like) using a measurement device are not needed, so that various problems of a sound tuning related company (including the sound engineer) with additional installation of the measurement device and the additional manual manipulation of the measurement device can be solved.

BRIEF DESCRIPTION OF DRAWINGS

The above and other features of the present invention will now be described in detail with reference to certain example embodiments thereof illustrated in the accompanying drawings which are given hereinbelow by way of illustration only, and thus are not limitative of the present invention, and wherein.

Figure 1:
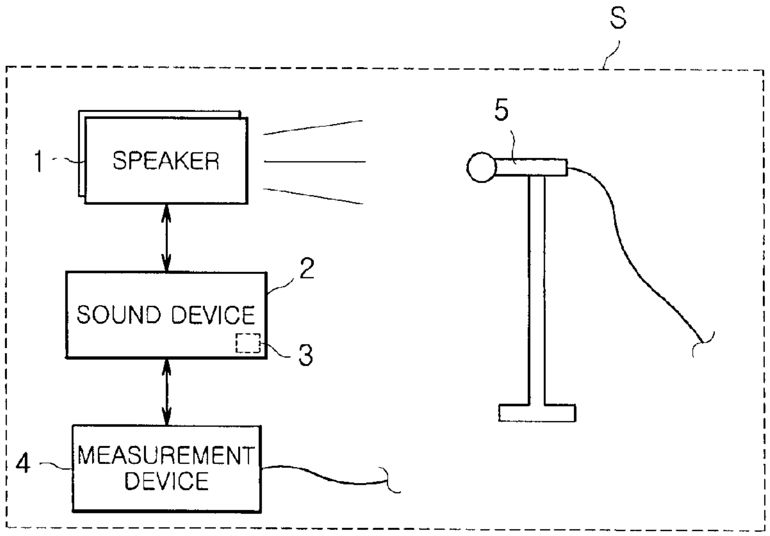
FIG. 1 is a view conceptually illustrating sound tuning operations according to a related art.
Figure 2:
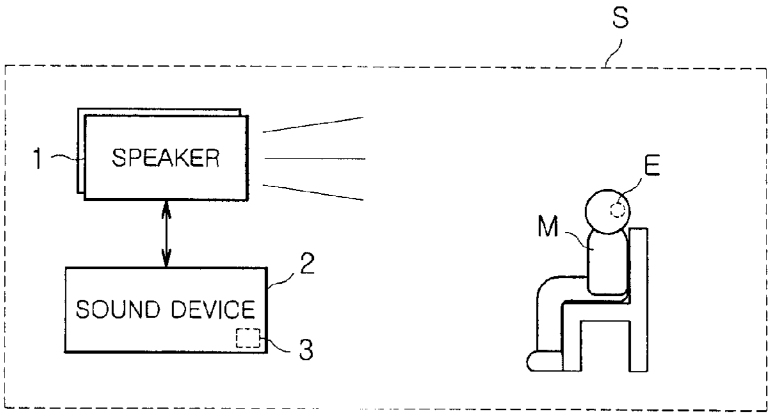
FIG. 2 is a view conceptually illustrating a situation in which a sound device and a multimedia system are actually used after completing the sound tuning operations according to the related art.

It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention thought the figures of the drawing.

BEST MODE FOR CARRYING OUT THE INVENTION

Hereinafter, reference will now be made in detail to various embodiments of the present invention, examples of which are illustrated in the accompanying drawings and described below. While the invention will be described in conjunction with example embodiments, it will be understood that the present description is not intended to limit the invention to those example embodiments. On the contrary, the invention is intended to cover not only the example embodiments, but also various alternatives, modifications, equivalents and other embodiments, which may be included within the spirit and scope of the invention as defined by the appended claims.

Now, a tuning sound (TS) feedback apparatus according to the present invention will be described in detail with reference to the accompanying drawings.

Figure 3:
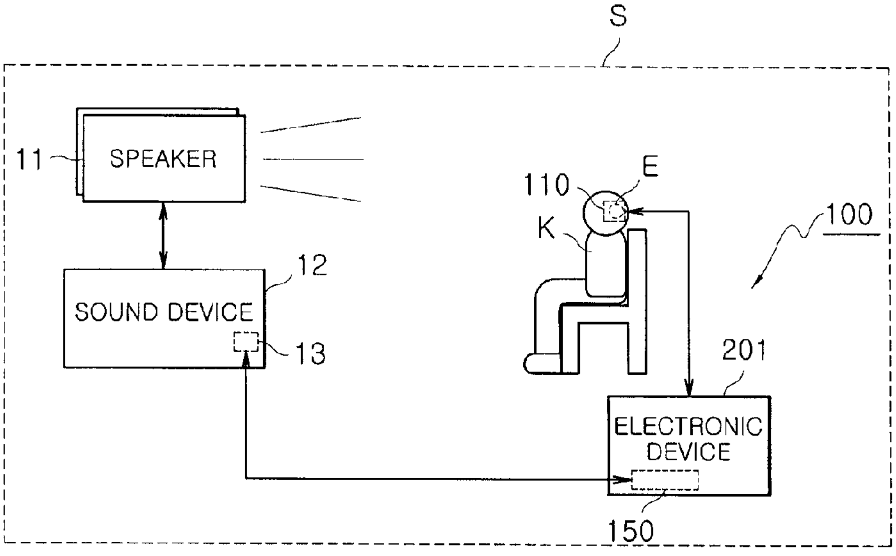
FIG. 3 is a view conceptually illustrating sound tuning operations using a tuning sound (TS) feedback apparatus according to the present invention.
Figure 4:
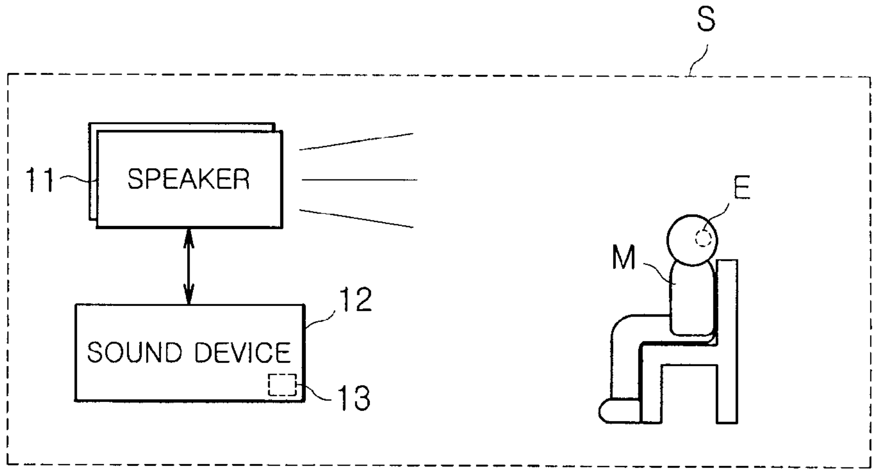
FIG. 4 is a view conceptually illustrating a situation in which a sound device and a multimedia system which are actually used after completing the sound tuning operations using the TS feedback apparatus according to the present invention.

As illustrated in FIG. 3, in a facility S (for example, a lecture hall, a broadcasting station, a house, a theater, a commercial facility, a car, or the like) having a sound device 12 and a multimedia system, a sound related company repeatedly performs a series of sound tuning operations by using a sound output terminal 11 such as a speaker and an equalizer 13 until proper sound is obtained so as to enable a listener M to easily hear sound data output from the sound output terminal 11 of the sound device 12 when the sound device 12 and the multimedia system are actually used as illustrated in FIG. 4.

Here, the TS output from the sound output terminal 11 is used as a basic source in a sound tuning mechanism managed by a sound engineer K. Thus, the problem of how to pick up corresponding TS and feed the TS back is considered as a very important factor in terms of sound tuning quality.

In this situation, as illustrated in FIG. 3, according to the present invention, there is provided a TS feedback apparatus 100 including a TS pick-up unit 110 which is disposed inside or near the hearing organ E of the sound engineer K unlike a conventional tuning microphone, and can pick up the TS output from the sound output terminal 11 of the sound device 12 and output and process the TS.

In this case, the TS pick-up unit 110 functions as the actual hearing organ E of the sound engineer K (see FIG. 3) and can exclusively and continuously perform the function of picking up the TS during the series of sound tuning operations.

In a case where the TS pick-up unit 110 is disposed inside or near the hearing organ E of the sound engineer K, a TS pick-up position is accurately the same as the position of the actual hearing organ E of the listener M (that is, the actual sound pick-up position of the listener M) as illustrated in FIG. 4. Therefore, the picked-up TS can be delicately matched to the sound the listener M hears when the sound device 12 and the multimedia system are actually used.

In this case, when the sound engineer K of the sound related company systematically manages and controls the series of sound tuning operations by using the TS picked up by the TS pick-up unit 110 as a source, the equalizer 13 of the sound device 12 can acquire a proper sound output ability. As a result, in a case where sound volume control operations are performed by the equalizer 13 in the sound device 12 and the multimedia system, sound data finally output from the sound output terminal 1 can represent the optimal sound quality (optimal pitch, clearness and tone quality) proper for the actual hearing situation of the listener M.

In addition, the listener M who is the final consumer of the sound data can avoid disadvantages caused by the degradation in sound data quality (pitch, clearness and tone quality).

Figure 5:
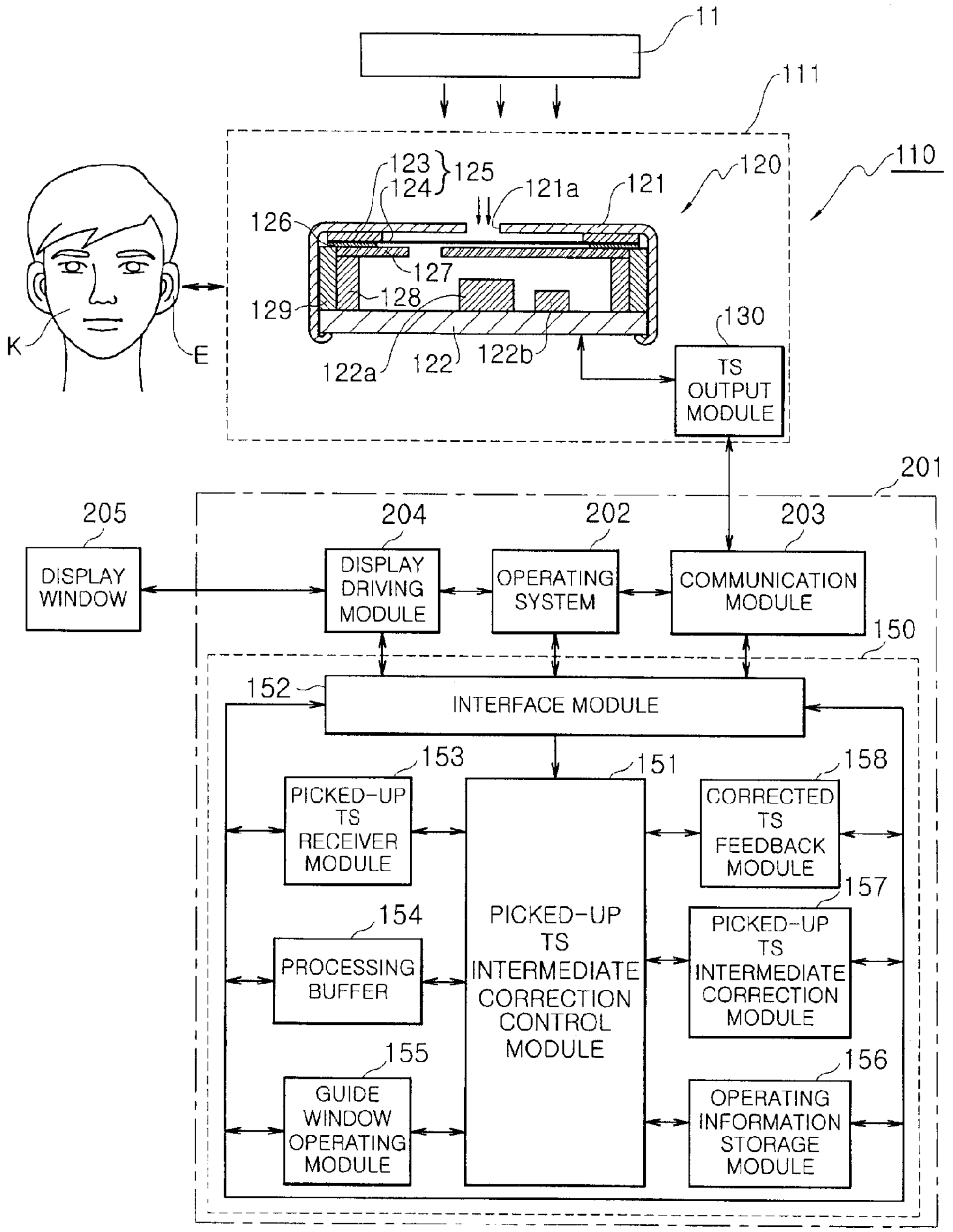
FIG. 5 is a view conceptually illustrating a detailed construction of the TS feedback apparatus according to the present invention.

Here, as illustrated in FIG. 5, the aforementioned TS pick-up unit 110 may include: a TS pick-up casing which is disposed and fixed inside or near the hearing organ of the sound engineer who manages the tuning operations of the sound output from the sound output terminal of the sound device having the equalizer; a sound/electric conversion element which is included in the TS pick-up casing and picks up the TS output from the sound output terminal of the sound device to convert the picked-up TS into an electrical signal; and a TS output module which is included in the TS pick-up casing, converts and processes the TS converted into the electrical signal by the sound/electric conversion element into wired or wireless communication data to be used for external communication, and outputs and transmits the communication data to the sound device.

Figure 6:
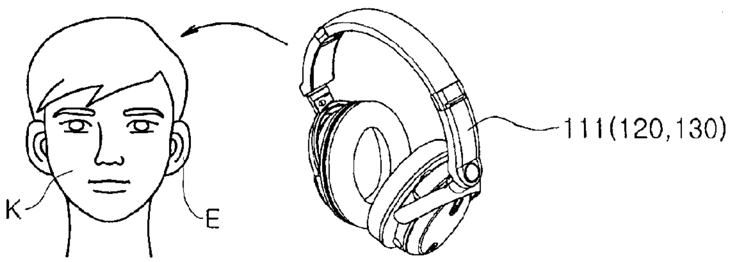
FIG. 6 is a view conceptually illustrating application types of a TS pick-up casing according to the present invention.
Figure 6:
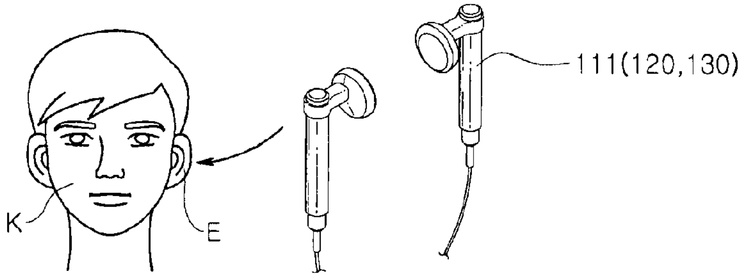
Figure 6:
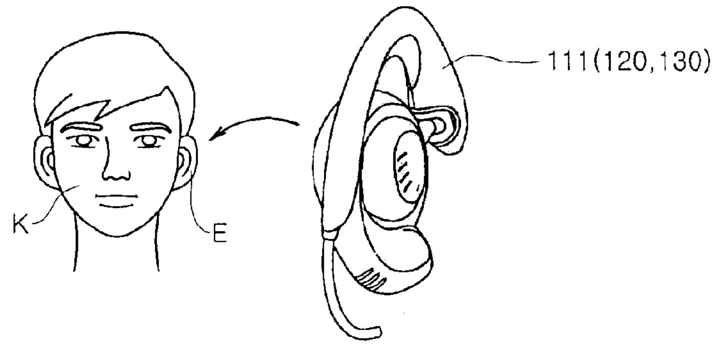

In this case, as illustrated in FIGS. 6*a* to 6*c*, the TS pick-up casing 111 may have a headset-type structure, an earphone-type structure, or an earring-type structure to be disposed and fixed inside or near the hearing organ E of the sound engineer K.

Here, as illustrated in FIG. 5, the sound/electric conversion element 120 according to the present invention may be constructed with, for example, a container 121 which has a shape of a barrel and is provided with a sound inlet 121*a*, components which are accommodated in an internal space of the container 121 and vibrate by the TS input through the TS pick-up casing 111 and the sound inlet 121*a*, and a printed circuit board (PCB) 122 which is accommodated in the internal space of the container 121 and electrically processes changes in capacitance caused by the vibration of the components. In this case, the PCB 122 may additionally include electric circuits 122*a* and 122*b* for electrical signal processing, for example, transistors, capacitors, and the like.

Here, the aforementioned components may include a vibration plate assembly 125, a spacer ring 126, an insulation base ring 129, a dielectric plate 127, a conductive base ring 128, and the like which are sequentially disposed in the internal space of the container 121.

In this case, the vibration plate assembly 125 may be constructed with a polar ring 123 and a vibration plate 124, and the dielectric plate 127 may be made of a metal material or a silicon (Si) material depending on circumstances.

Here, the aforementioned container 121 is made of, for example, aluminum (Al) or copper (Cu), the polar ring 123 may be made of a brass plate plated with, for example, nickel (Ni), the spacer ring 126 may be made of a polyethylene terephthalate (PET) film having a thickness of, for example, about from 35 μm to 46 μm, and the vibration plate 124 may be made of a PET film which is coated with gold or Ni and has a thickness of about from 2.5 μm to 3.5 μm.

Here, the conductive base ring 128 electrically connects the dielectric plate 127 to the PCB 122 and, when a change in a current signal occurs due to a change in a gap between the vibration plate 124 of the vibration plate assembly 125 and the dielectric plate 127, performs a function of transferring the change in the current signal to a transistor of the PCB 122. The insulation base ring 129 covers the edges of the conductive base ring 128 and the dielectric plate 127 and performs a function of blocking the conductive base ring 128 and the dielectric plate 127 so as not to be electrically connected to an inner wall of the container 121. The sound/electric conversion element 120 having the aforementioned construction is only an example of a sound/electric conversion element that can be employed by the present invention, and various types of sound/electric conversion elements can be included in the TS pick-up casing 111 to be applied depending on circumstances.

In the arrangement structure of the sound/electric conversion element 120 having the aforementioned construction, when TS is output from the sound output terminal 11 of the sound device 12 and the TS is input through the TS pick-up casing 111 and the sound inlet 121*a* of the container 121, the vibration plate 124 vibrates at a predetermined speed by the TS.

Of course, as the vibration plate 124 vibrates, the gap between the vibration plate 124 and the dielectric plate 127 is changed at a predetermined speed due to the vibration, and due to the change in the gap, the electrostatic field between the vibration plate 124 and the dielectric plate 127 is also changed by the TS. Consequently, according to electrostatic induction, the potential of the dielectric plate 127 changes rapidly in response to the TS.

In this state, when the varying potential value of the dielectric plate 127 is transmitted to a gate electrode of the transistor included in the PCB 122 through the conductive base ring 128 as a medium, the transistor amplifies the current value according to the varying potential value. Thereafter, an operation of outputting this to a TS output module 130 can be properly performed, and the TS picked up by the TS pick-up unit 110 is converted into an electrical signal, thereby creating a stable environment for feeding the TS back to the sound device 12 (see FIG. 5).

Figure 7:
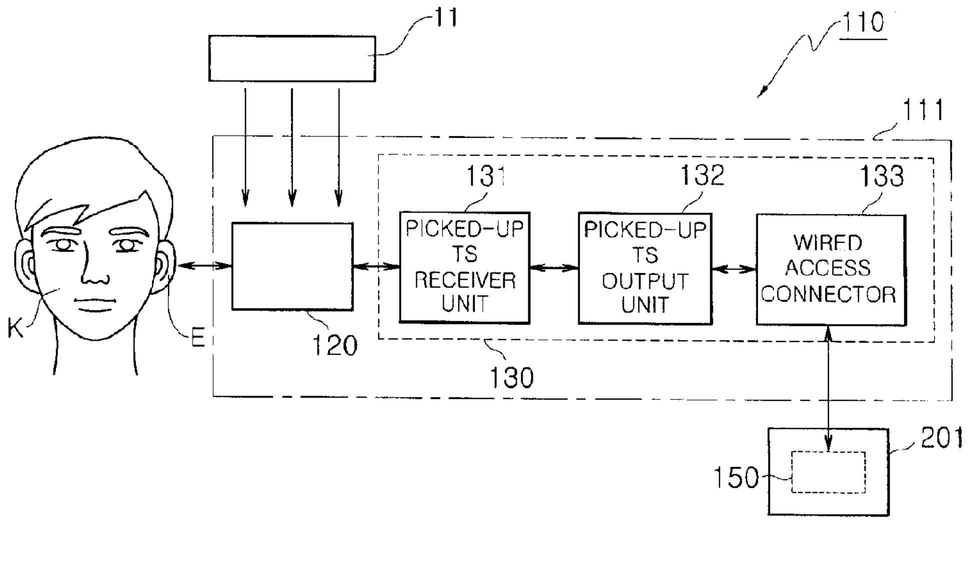
FIGS. 7 and 8 are views conceptually illustrating a detailed construction of a TS output module according to the present invention.

As described above, in the TS pick-up casing 111 according to the present invention, the TS output module 130 is further included along with the sound/electric conversion element 120. In this case, as illustrated in FIG. 7, the TS output module 130 according to the present invention may have a wired communication type construction including, for example, a picked-up TS receiver unit 131, a picked-up TS output unit 132, and a wired access connector 133.

In this case, the picked-up TS receiver unit 131 has an electrical connection relationship with the sound/electric conversion element 120 and performs a function of receiving the picked-up TS converted into the electrical signal by the sound/electric conversion element 120. The wired access connector 133 may have a structure connected to an electronic device 201 described later with a wire line such as a universal serial bus (USB) cable and perform a function of interfacing the TS output module 130 with the electronic device 201 through wired communication.

In this situation, the picked-up TS output unit 132 collects the picked-up TS received by the picked-up TS receiver unit 131 and can process and convert a packet structure of the received picked-up TS into a structure to be used for wired communication by executing a series of data processing and conversion routines. Thereafter, the picked-up TS output unit 132 may perform a function of outputting and transmitting the converted picked-up TS to the electronic device 201 through the wired access connector 133, and the TS picked up by the TS pick-up unit 110 is transmitted to the electronic device 201 in a normal transmission operation, thereby creating a stable environment for feeding the TS back to the sound device 12 (see FIG. 5).

Figure 8:
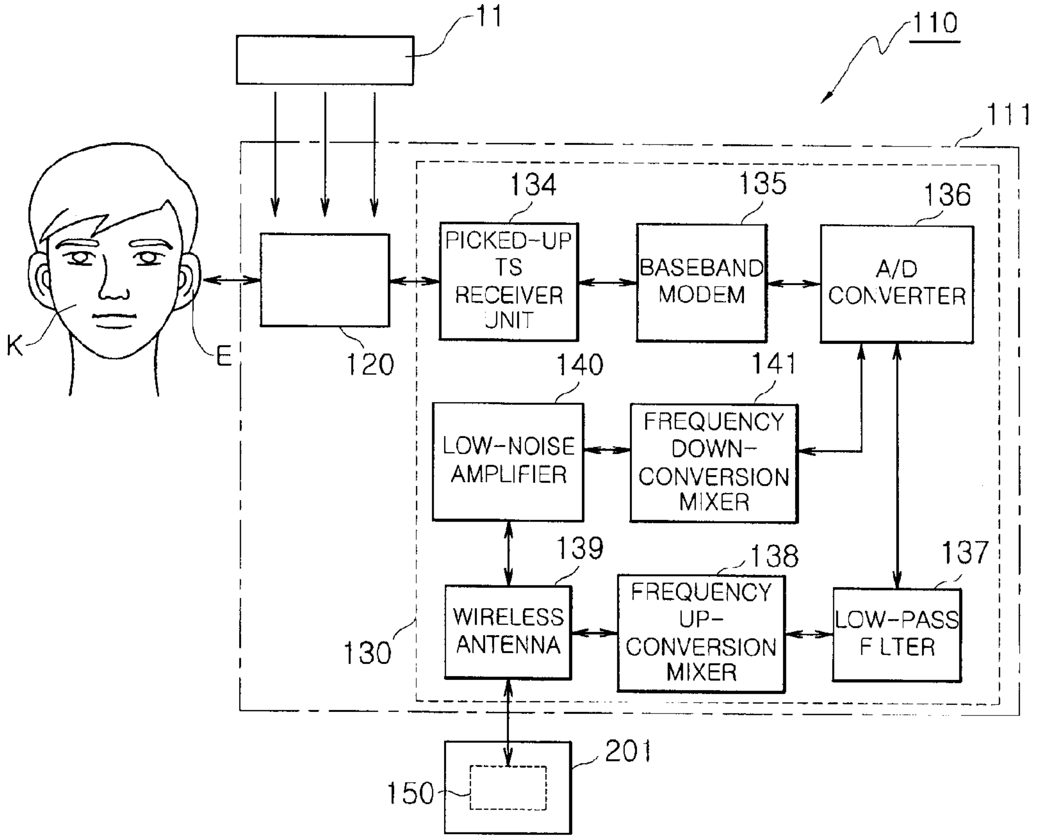

As illustrated in FIG. 8, depending on circumstances, the TS output module 130 according to the present invention which belongs to the TS pick-up unit 110 may have a wireless communication type structure constructed with a picked-up TS receiver unit 134, a baseband modem 135, an analog-to-digital (A/D) converter 136, a low-pass filter 137, a frequency up-conversion mixer 138, a low-noise amplifier 140, a frequency down-conversion mixer 141, a wireless antenna 139, and the like.

In this case, the wireless antenna 139 may perform the functions of selectively forming a structure connected to a wireless local area network (WLAN) and up-streaming data (for example, the picked-up TS data) output from the components of the TS output module 130 to the electronic device 201 connecting the WLAN. In addition, the wireless antenna 139 may perform the functions of receiving data (for example, data for checking connection and maintenance of wireless communication) down-streamed from the electronic device 201 connecting the WLAN and down-streaming the received data to the components of the TS output module 130.

As the wireless antenna 139, for example, an antenna having a substrate pattern type designed to be proper for a 2.4 GHz frequency band, an antenna having a ceramic bar type designed to be proper for the 2.4 GHz frequency band, or the like may be selected.

In this situation, the picked-up TS receiver unit 134 may have an electrical connection relationship with the sound/electric conversion element 120 and perform a function of receiving the picked-up TS converted into the electrical signal by the sound/electric conversion element 120. The baseband modem 135 may perform a function of modulating the picked-up TS received by the picked-up TS receiver unit 134 into a digital signal corresponding to the norm of a physical layer of the electronic device 201.

In addition, the A/D converter 136 may perform a function of converting a digital modulation signal output from the baseband modem 135 into an analog modulation signal, or converting a radio frequency (RF) modulation signal (for example, data for checking connection and maintenance of wireless communication) of the electronic device 201 received through the wireless antenna 139 into a digital modulation signal to be output to the baseband modem 135. The low-pass filter 137 may perform a function of removing a direct current (DC) offset of the analog modulation signal converted by the A/D converter 136 and perform low-pass filtering on a corresponding modulation signal to have a bandwidth corresponding to a transmission norm of wireless communication.

In addition, the frequency up-conversion mixer 138 may perform the functions of generating an RF modulation signal by performing up-conversion on in-phase and quadrature components of the analog modulation signal passing though the low-pass filter 137 into RF bands corresponding to the transmission norm of wireless communication and outputting the generated RF modulation signal (for example, the picked-up TS data) to the electronic device 201 through the wireless antenna 139.

Furthermore, the low-noise amplifier 140 may perform a function of performing low-noise amplification on the RF modulation signal (for example, data for checking connection and maintenance of wireless communication) of the electronic device 201 received through the wireless antenna 139. The frequency down-conversion mixer 141 may perform a function of converting in-phase and quadrature components of the RF modulation signal that is low-noise amplified by the low-noise amplifier 140 into baseband modulation signals and outputting the converted signals to the A/D converter 136.

Of course, while the wireless communication type computation modules perform their functions, the picked-up TS converted into the electrical signal by the sound/electric conversion element 120 can normally be transmitted to the electronic device 201 through the wireless antenna 139 in a normal transmission operation, thereby creating a stable environment for feeding the TS back to the sound device 12 (see FIG. 5).

As described above, in the facility S including the sound device 12 and the multimedia system, the sound engineer manages and repeatedly performs the series of sound tuning operations using the sound output terminal 11 such as the speaker and the equalizer 13 until proper sound is obtained. In this situation, the TS picked up by the TS pick-up unit 110 according to the present invention is fed back to the sound device 12 (see FIG. 3).

In the picked-up TS feedback operation, conventionally, operations of connecting and installing a large measurement device to a part of the sound device and receiving the feedback of the picked-up TS through the measurement device, operations of measuring the fed-back TS using the measurement device, controlling a volume level of the TS manually, and re-outputting the volume level-controlled TS through the sound output terminal, and the like are performed. Therefore, conventionally, the sound related companies have various additional problems such as a problem of additional installation of the measurement device, a problem of additional manual manipulation of the measurement device, and the like.

In this situation, as illustrated in FIG. 3, according to the present invention, a picked-up TS intermediate correction unit 150 may further be provided on a picked-up TS feedback path between the TS pick-up unit 110 and the sound device 12. The picked-up TS intermediate correction unit 150 may perform functions of receiving the picked-up TS output and transmitted from the TS pick-up unit 110, automatically performing the intermediate correction on the volume level of the picked-up TS by increasing or decreasing the volume level of the received picked-up TS with respect to a reference hearing line J, and feeding the corrected TS to the equalizer 13 of the sound device 12 (see FIGS. 10 and 11). In this case, the picked-up TS intermediate correction unit 150 may have a structure included in the electronic device 201 which performs wired/wireless communications with the TS pick-up unit 110 and the sound device 12.

Here, as the electronic device 201 including the picked-up TS intermediate correction unit 150, for example, for a computing device such as a notebook, a mobile device such as a cellular phone, a personal communications service (PCS) phone, a synchronous or asynchronous International Mobile Telecommunications-2000 (IMT-2000), a palm personal computer (PC), a personal digital assistant (PDA), a smart phone, a wireless application protocol (WAP) phone, a PlayStation, or the like may be selected by the sound engineer K depending on circumstances.

As described above, in a case where the automatic correction operation performed with respect to the reference hearing line J is performed on the volume level of the TS picked up by the TS pick-up unit 110 by the picked-up TS intermediate correction unit 150 at the intermediate time point, the sound engineer K may stably skip a series of manual operations using the measurement device (for example, an operation of performing self-measurement of the fed-back TS, an operation of performing self-control of the volume level of the fed-back TS, and the like) which are inevitable in conventional methods, from the sound tuning operations. Accordingly, the sound tuning related company (including the sound engineer) can solve the various problems with the additional installation of the measurement device and the additional manual manipulation of the measurement device.

Here, as illustrated in FIG. 5, the TS intermediate correction unit 150 according to the present invention may include a picked-up TS intermediate correction control module 151, a guide window operating module 155 under a control system of the picked-up TS intermediate correction control module 151, a picked-up TS receiver module 153, an operation information storage module 156, a picked-up TS intermediate correction module 157, a corrected TS feedback module 158, and the like.

In this case, the picked-up TS intermediate correction control module 151 may perform functions of forming a series of signal correction relationships with an operating system 202, a display driving module 204, a communication module 203, and the like included in the electronic device 201 as mediated by an interface module 152 and controlling the entire TS intermediate correction operations.

Figure 9:
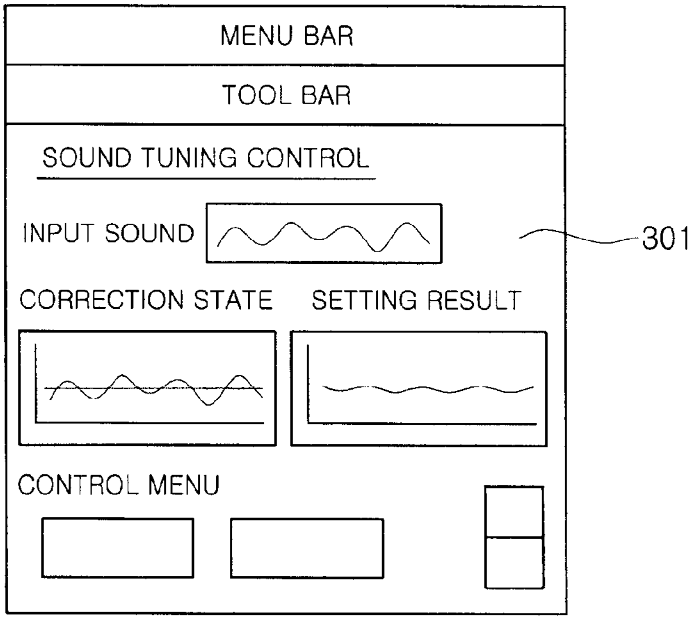
FIG. 9 is a view conceptually illustrating a display type of a guide window according to the present invention.

Here, in a case where the sound engineer K activates the TS intermediate correction unit 150 by computationally manipulating the electronic device 201, the guide window operating module 155 controlled by the picked-up TS intermediate correction control module 151 may perform functions of communicating with the operating system 202 and the display driving module 204 and accessing the operating information storage module 156, flexibly extracting various types of operating information stored in the operating information storage module 156 such as text, image, link or program information for generating a guide window, skin information, setting information, and the like, generating a guide window 301 as illustrated in FIG. 9 on the basis of the extracted operating information, and selectively outputting and displaying the generated guide window 301 on a display window 205 provided at the electronic device 201.

The guide window 301 has, for example, a menu for checking the current state of the picked-up TS, a menu for checking the corrected state of the picked-up TS, a menu for controlling the function of the picked-up TS intermediate correction module, a menu for checking the result of correcting the picked-up TS, or the like. Therefore, the sound engineer K can control, for example, the operation of checking the current state of the picked-up TS, the operation of checking the corrected state of the picked-up TS, the operation of controlling the function of the picked-up TS intermediate correction module, and the operation of checking the result of correcting the picked-up TS, or the like, through very simple computational operations for selectively manipulating (inputting) and checking the menu items displayed on the guide window 301.

Here, the operating information storage module 156 controlled by the picked-up TS intermediate correction control module 151 may perform a function of stably storing and managing various types of operating information used for operating the TS intermediate correction unit 150, for example, the text, image, link or program information used for generating the guide window 301, the skin information, the setting information, registration information on the operating system 202, registration information on the communication module 203, registration information on the display driving module 204, resource state information on the unit 150, program component information and reference hearing line information used for controlling the volume level of the picked-up TS, and the like.

In this case, according to the present invention, after generating a predetermined pink noise, a flat state (that is, a state in which all measured frequencies maintain a reference volume having a predetermined value) of the pink noise is selected as the reference hearing line (here, the reference hearing line represents a relative value of a hearing level) for correcting the picked-up TS.

In this situation with the base infrastructure, the picked-up TS receiver module 153 controlled by the picked-up TS intermediate correction control module 151 may perform functions of communicating with the TS output module 130 that belongs to the TS pick-up unit 110 as mediated by the interface module 152 or the communication module 203, receiving the picked-up TS output and transmitted from the TS output module 130, and stably storing and managing the received picked-up TS in a processing buffer 154.

Figure 10:
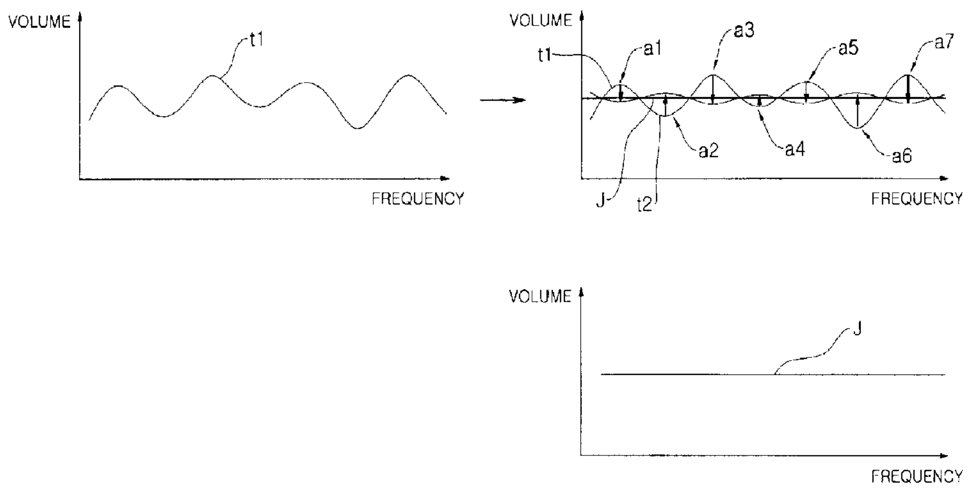
FIGS. 10 and 11 are views conceptually illustrating operations of a picked-up TS intermediate correction unit according to the present invention.

Accordingly, in this situation in which the TS completely picked-up by the TS pick-up unit 110 is stored in the processing buffer 154, the picked-up TS intermediate correction module 157 controlled by the picked-up TS intermediate correction control module 151 may perform functions of communicating with the processing buffer 154, the operating information storage module 156, and the like, and as illustrated in FIG. 10, extracting the picked-up TS received by the picked-up TS receiver module 153 and the reference hearing line J for uniformly maintaining the predetermined reference volume value.

When the picked-up TS and the reference hearing line J are extracted through the aforementioned operations, with reference to the program component information stored in the operating information storage module 156, the picked-up TS intermediate correction module 157 performs a series of data correction routines as illustrated in FIG. 10 to increase or decrease the volume level of a volume level curve T1 for each frequency of the picked-up TS with respect to the reference hearing line J.

In the correction operations, in order for the volume level of the volume level curve T1 for each frequency of the picked-up TS to be corrected, in areas a1, a2, a3, a4, a5, a6, a7, and the like (of course, including other areas), with respect to the reference hearing line J, a volume level lower than the volume level of the reference hearing line J is corrected to be higher than the volume level of the reference hearing line J, and a volume level higher than the volume level of the reference hearing line J is corrected to be lower than the volume level of the reference hearing line J, so that the picked-up TS is converted into the corrected TS having a volume level curve T2 of which the volume level is automatically intermediate-corrected to approximate to the reference hearing line J.

Figure 11:
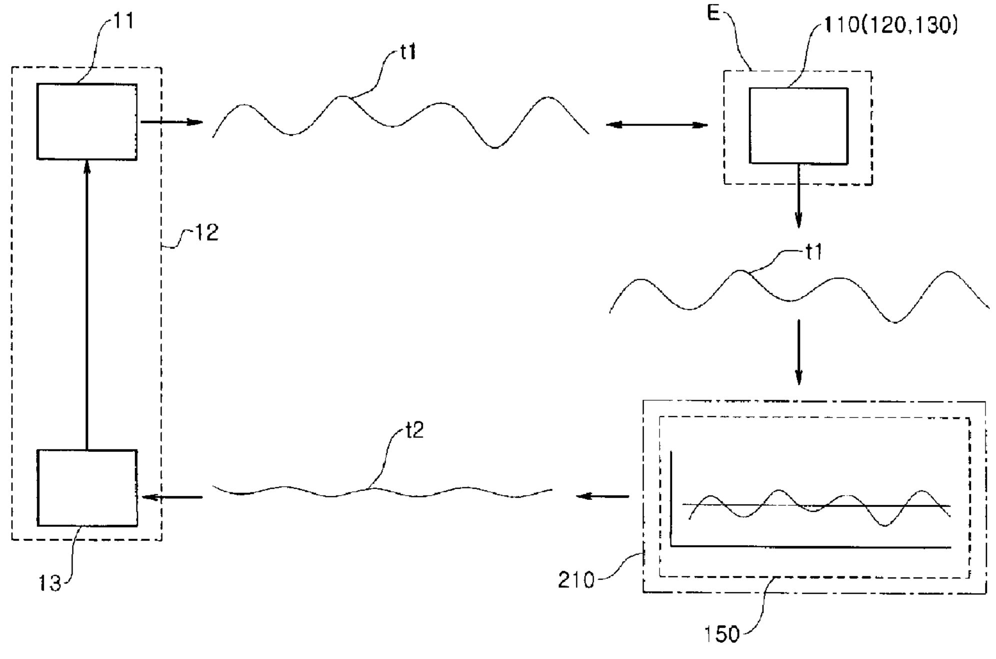

When the corrected TS corresponding to the picked-up TS is generated as described above, the corrected TS feedback module 158 controlled by the picked-up TS intermediate correction control module 151 may perform functions of communicating with the sound device 12 wiredly or wirelessly as mediated by the interface module 152 and the communication module 203 as illustrated in FIG. 11 and feeding the generated corrected TS, that is, the corrected TS having the volume level curve T2 of which the volume level is automatically intermediate-corrected to approximate to the reference hearing line J back to the equalizer 13 of the sound device 12.

Thereafter, as illustrated in FIG. 3, the sound engineer K repeatedly performs the series of sound tuning operations using the TS feedback apparatus 100 according to the present invention to enable the listener M to hear more proper sound data output from the sound output terminal 11 of the sound device 12 in a case where the sound device 12 and the multimedia system are used (see FIG. 4).

The present invention may be useful in various types of multimedia systems and electronic devices (as well as non-electronic devices) requiring sound tuning.

The invention has been described in detail with reference to preferred embodiments thereof. However, it will be appreciated by those skilled in the art that changes may be made in these embodiments without departing from the principles and spirit of the invention, the scope of which is defined in the accompanying claims and their equivalents.

INDUSTRIAL APPLICABILITY

Embodiments of the present invention relate to a tuning sound (TS) feedback apparatus, more particularly, to a TS feedback apparatus including sound pick-up modules which are systematically connected and disposed to be used for picking up a TS output from a sound output terminal of a sound device in a state disposed inside or near the hearing organ of a sound engineer, unlike a conventional tuning microphone, and transmitting feedback of the TS so as to enable a TS pick-up position and a position of the actual hearing organ of the listener (that is, the actual sound pick-up position of a listener) to be the same, thereby maximizing reliability of sound tuning operations using the TS as a source and enabling an equalizer of the sound device to have a proper level sound output ability.

The invention claimed is:

1. A tuning sound (TS) feedback apparatus comprising:

a TS pick-up casing which is configured to be disposed and fixed inside the hearing organ of a sound engineer who manages tuning operations for sound output from a sound output terminal of a sound device having an equalizer;

a sound/electric conversion element which is disposed and included in the TS pick-up casing, picks up the TS output from the sound output terminal of the sound device, and converts the picked-up TS into an electrical signal;

a TS output module which is included in the TS pick-up casing, converts the converted TS into wired or wireless communication data to be used for external communication, and transmits the data to the sound device; and a picked-up TS intermediate correction unit which is disposed in an electronic device connected to the TS output module wiredly or wirelessly, receives the picked-up TS transmitted from the TS output module, corrects a volume level of the picked-up TS, and feeds the corrected TS back to the equalizer of the sound device, wherein the picked-up TS intermediate correction unit comprises:

a picked-up TS intermediate correction control module for controlling the entire intermediate correction operations for the picked-up TS;

a picked-up TS receiver module which communicates with the TS output module and receives the picked-up TS transmitted from the TS output module;

a picked-up TS intermediate correction module which corrects a volume level of the received TS to a reference hearing line;

a corrected TS feedback module which feeds the corrected TS generated back to the equalizer of the sound device;

an operation information storage module which stores various types of operating information including text information, image information, link or program information for generating a guide window, skin information, and setting information; and a guide window operating module which i) communicates with a display driving module of the electronic device, ii) extracts the operating information stored in the operation information storage module, iii) generates the guide window based on the extracted operating information, and iv) selectively outputting and displaying the generated guide window on a display window provided at the electric device.

2. The TS feedback apparatus of claim 1, wherein the TS output module comprises:

a picked-up TS receiver unit which receives the picked-up TS converted into the electrical signal from the sound/electric conversion device;

a picked-up TS output unit which converts the received TS to be used for communication; and a wired access connector which is connected to and communicates with the electronic device.

3. A tuning sound (TS) feedback apparatus comprising:

a TS pick-up casing which is configured to be disposed and fixed to contact or cover the hearing organ of a sound engineer who manages tuning operations for sound output from a sound output terminal of a sound device having an equalizer;

a sound/electric conversion element which is disposed and included in a portion of the TS pick-up casing, picks up the TS output from the sound output terminal of the sound device, and converts the picked-up TS into an electrical signal, wherein the portion is configured to be disposed and fixed to contact or cover the hearing organ of the sound engineer;

a TS output module which is included in the TS pick-up casing, converts the converted TS into wired or wireless communication data to be used for external communication, and transmits the data to the sound device; and a picked-up TS intermediate correction unit which is disposed in an electronic device connected to the TS output module wiredly or wirelessly, receives the picked-up TS transmitted from the TS output module, corrects a volume level of the picked-up TS, and feeds the corrected TS back to the equalizer of the sound device, wherein the picked-up TS intermediate correction unit comprises:

a picked-up TS intermediate correction control module for controlling the entire intermediate correction operations for the picked-up TS;

a picked-up TS receiver module which communicates with the TS output module and receives the picked-up TS transmitted from the TS output module;

a picked-up TS intermediate correction module which corrects a volume level of the received TS to a reference hearing line;

a corrected TS feedback module which feeds the corrected TS generated back to the equalizer of the sound device;

an operation information storage module which stores various types of operating information including text information, image information, link or program information for generating a guide window, skin information, and setting information; and a guide window operating module which i) communicates with a display driving module of the electronic device, ii) extracts the operating information stored in the operation information storage module, iii) generates the guide window based on the extracted operating information, and iv) selectively outputting and displaying the generated guide window on a display window provided at the electric device.

4. The TS feedback apparatus of claim 3, wherein the TS output module comprises:

a picked-up TS receiver unit which receives the picked-up TS converted into the electrical signal from the sound/electric conversion device;

a picked-up TS output unit which converts the received TS to be used for communication; and a wired access connector which is connected to and communicates with the electronic device.

* * * * *